US007015738B1

(12) United States Patent
Cao

(10) Patent No.: US 7,015,738 B1
(45) Date of Patent: Mar. 21, 2006

(54) DIRECT MODULATION OF A VOLTAGE-CONTROLLED OSCILLATOR (VCO) WITH ADAPTIVE GAIN CONTROL

(76) Inventor: Weixun Cao, 10175 McLaren Pl., Cupertino, CA (US) 95014

(*) Notice: Subject to any disclaimer, the term of this patent is extended or adjusted under 35 U.S.C. 154(b) by 0 days.

(21) Appl. No.: 10/871,850

(22) Filed: Jun. 17, 2004

Related U.S. Application Data

(60) Provisional application No. 60/479,743, filed on Jun. 18, 2003.

(51) Int. Cl.
*H03L 7/00* (2006.01)
(52) U.S. Cl. .................. 327/159; 327/156; 331/10
(58) Field of Classification Search ............ 327/141, 327/146–148, 156–159; 331/1 A, 10–17
See application file for complete search history.

(56) References Cited

U.S. PATENT DOCUMENTS

| | | | | |
|---|---|---|---|---|
| 5,079,522 A | * | 1/1992 | Owen et al. .................. 331/16 |
| 5,334,952 A | * | 8/1994 | Maddy et al. ............... 331/1 A |
| 5,483,203 A | * | 1/1996 | Rottinghaus ................. 331/10 |
| 5,631,920 A | * | 5/1997 | Hardin ........................ 375/130 |
| 6,211,747 B1 | * | 4/2001 | Trichet et al. .............. 332/128 |
| 6,294,936 B1 | * | 9/2001 | Clementi .................... 327/156 |
| 6,441,690 B1 | * | 8/2002 | Savelli et al. ............... 331/1 A |
| 6,844,763 B1 | * | 1/2005 | Balboni ....................... 327/159 |
| 6,909,331 B1 | * | 6/2005 | Ballantyne .................... 331/10 |

OTHER PUBLICATIONS

M. H. Perrot, T. L. Tewksburg III, C. G. Sodini, "A 27-mW CMOS Fractional-N Synthesizer Using Digital Compensation for 2.5-Mb/s GFSK Modulation", IEEE Journal of Solid-State Circuits, pp. 2048-2060, vol. 32, No. 12, Dec. 1997.
R. D. Beards and M. A. Copeland, "An Oversampling Delta-Sigma Frequency Discriminator", IEEE Trans. on Circuits and Systems-II, pp. 26-32, vol. 41, No. 1, Jan. 1994.

* cited by examiner

*Primary Examiner*—Dinh T. Le
(74) *Attorney, Agent, or Firm*—Joe Zheng

(57) ABSTRACT

Techniques for direct modulation of a voltage-controlled oscillator (VCO) with adaptive digital gain control for wideband wireless applications are disclosed. A digital adaptive gain control loop is used to directly modulate the VCO, and a phase-locked loop (PLL) to track the frequency drift and other nonlinear effects of the VCO. As the PLL is applied to track the carrier frequency without passing the modulation signal into the PLL loop filter, the PLL can be implemented with a narrow loop bandwidth. The wideband frequency modulated signal is directly up-converted to the radio frequency (RF) signal by directly modulating the VCO through a digital-to-analog converter which is digitally controlled by an adaptive gain control loop. Thus, both wide bandwidth and low output noise for a frequency synthesizer and modulator can be achieved.

16 Claims, 3 Drawing Sheets

DIRECT MODULATION OF A VOLTAGE-CONTROLLED OSCILLATOR (VCO) WITH ADAPTIVE GAIN CONTROL

CROSS REFERENCE TO RELATED APPLICATION

This application claims the benefit of U.S. Provisional Application entitled "Direct Modulation Of A Voltage-Controlled Oscillator (VCO) With Adaptive Gain Control", No. 60/479,743, filed on Jun. 18, 2003, the content of which is hereby incorporated by reference for all purpose in its entirety.

BACKGROUND OF THE INVENTION

1. Field of the Invention

The present invention relates generally to the field of digital wireless communications. Specifically, the present invention relates to architectures of a digitally controlled wideband radio frequency (RF) modulator and synthesizer system. More specifically, the present invention relates to frequency modulation architectures that can operate in different modulation standards and different frequency bands by using adaptive digital signal processing techniques.

2. Description of the Related Art

There are many challenging implementation issues associated with the direct modulation of a VCO with an analog waveform consistent with the instantaneous frequency specification. The main problem is due to frequency instability, drift and phase noise in the VCO. A typical approach to solve this problem is to directly modulate a phase-locked loop (PLL) frequency synthesizer rather than directly modulating a VCO. One example of direct phase modulation is to use a fractional-N frequency synthesizer 100 as illustrated in FIG. 1. But the bandwith of the fractional-N frequency synthesizer 100 is strongly limited by its phase-looked loop formed by a divider 104, a phase detector 103, a loop filter 102 and a VCO 101. One significant drawback of the Fractional-N frequency synthesizer is that the modulation bandwidth must be less than the PLL bandwidth. This constraint imposes a severe conflict between achieving high data rates and good noise performance. The high data rates require a wide PLL bandwidth, but low output noise requires a low PLL bandwidth in order to properly attenuate the sigma-delta quantization noise.

In particular, the article "A 27-mW CMOS Fractional-N Synthesizer Using Digital Compensation for 2.5 Mb/s GFSK Modulation" by Michael H. Perrott and etc., IEEE Journal of Solid-State Circuits, Vol. 32, No. 12, December 1997, pages 2048 to 2060, describes a wideband fractional-N synthesizer. It requires a compensated transmit filter that is difficult to implement, and an accurate loop filter to mitigate the mismatch problem. However, this approach is not efficient for the implementation of a wide band frequency modulator or synthesizer at low cost.

There is thus a great need for a frequency modulator or a frequency synthesizer architecture that can allow the modulation bandwidth to exceed the PLL bandwidth, while keeping low phase noise and eliminating frequency drift.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

The present invention, generally speaking, provides techniques of direct modulation of a voltage-controlled oscillator (VCO). According to one aspect of the present invention, a digital adaptive gain control loop is used to directly modulate the VCO in an open loop manner, and a phase-locked loop (PLL) is used to track the frequency drift error of the VCO. The gain of the VCO is adaptively digitally controlled to compensate the frequency drift and other nonlinear effects in the VCO. As the PLL is applied to track the carrier frequency without passing the modulation signal into the loop filter, it can be implemented using a narrow loop bandwidth. The wide bandwidth frequency modulated signal is directly up-converted to the radio frequency (RF) signal by directly modulating the VCO through a digital-to-analog converter. Thus, both wide bandwidth and low output noise for a frequency modulation can be simultaneously achieved.

One of the features, benefits and advantages is to provide a wideband frequency modulation architecture using the direct modulation of a VCO. In operation, such an architecture essentially eliminates the intermediate frequency (IF) up-conversion mixer and costly band pass filters for conventional transmitter chains.

Other objects, features, benefits and advantages, together with the foregoing, are attained in the exercise of the invention in the following description and resulting in the embodiment illustrated in the accompanying drawings.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE PREFERRED EMBODIMENTS

The detailed description of the present invention is presented largely in terms of functional blocks, procedures, logic blocks, processing, or other symbolic representations that directly or indirectly resemble the operations of a frequency modulator that can be used in wireless communications. These descriptions and representations are typically used by those skilled in the art to most effectively convey the substance of their work to others skilled in the art.

Reference herein to "one embodiment" or "another embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
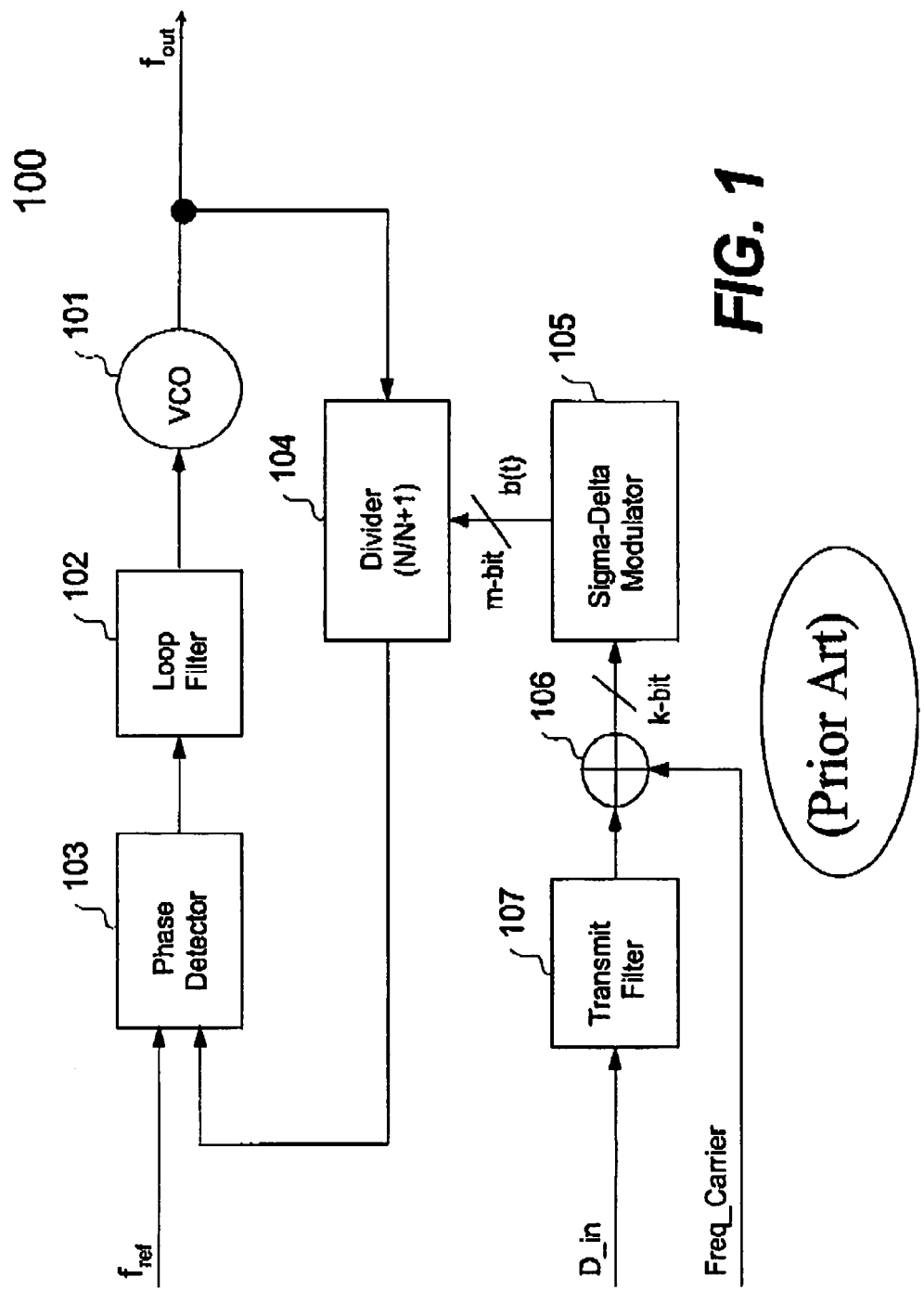
FIG. 1 is a block diagram of a conventional phase-locked loop fractional-N frequency synthesizer.

Referring now to the drawings, in which like numerals refer to like parts throughout the several views. As illustrated in FIG. 1, there is shown a fractional-N frequency synthesizer. The reference frequency, $f_{ref}$, is necessary to phase lock the VCO 101 to a stable source. The baseband digital data, D_in, is provided to the transmit filter 107 to generate a modulated data stream with smooth transition. The output of transmit filter 107 is added to the carrier frequency, Freq_Carrier. The output of the adder 106 is fed into a sigma-delta modulator 105 whose output changes the divide ratio of the divider 104. The detailed description of delta-sigma modulation can be found in the book "Delta-Sigma Data Converters" written by S. R. Norsworthy, R. Schreier and G. C. Temes, IEEE Press, 1997, which is hereby incorporated by reference. The output of the divider 104 is applied to a phase detector 103, together with a reference frequency, $f_{ref}$. The output of the phase detector 103 is an error signal, which is filtered using low pass loop filter 102 to form a control signal coupled to VCO 101. The VCO 101 generates an output signal, $f_{out}$, which is fed back into divider 104 through the feedback path. The sigma-delta modulator 105 and dual modulus N/(N+1) divider 104 comprise a fractional-N divider which is used in the feedback path of the PLL 100. Thus, a spurious free output signal is obtained by dithering the division ratio.

As a result of this approach, the desired baseband digital signal with phase information can be generated directly at the required radio frequency with no intermediate frequency (IF) conversion stages. The fraction-N division frequency synthesizer approach allows fine output frequency resolution, and reduces the overall phase noise. However, one significant drawback of the fractional-N frequency synthesizer is that the modulation bandwidth must be less than the PLL bandwidth. This constraint imposes a severe conflict between achieving high data rates and good noise performance. The high data rates require a wide PLL bandwidth, but low output noise requires a low PLL bandwidth in order to properly attenuate the sigma-delta quantization noise. It can be appreciated that these problems can be readily solved by the architecture illustrated in FIG. 2.

Figure 2:
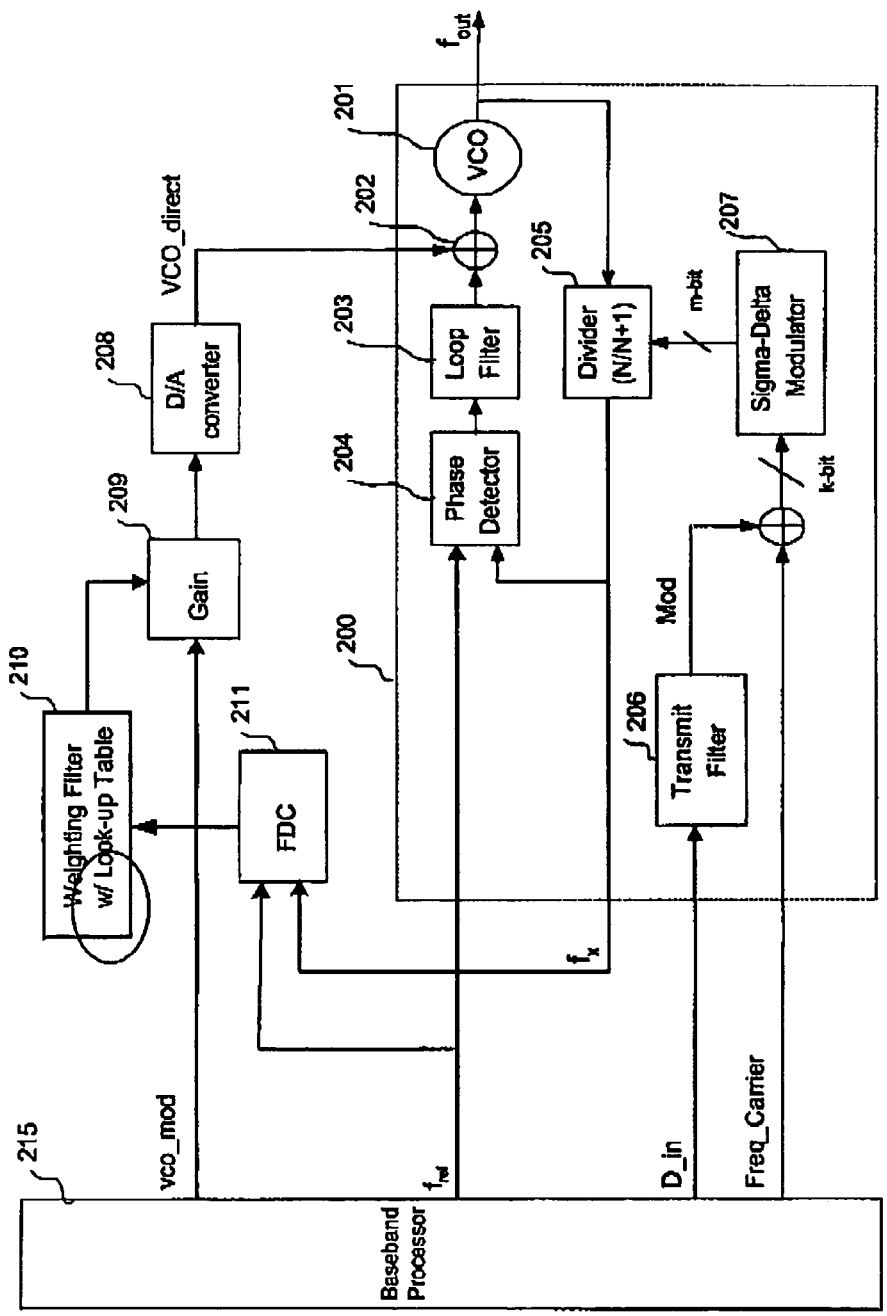
FIG. 2 is a block diagram showing an exemplary embodiment of the direct modulation of a VCO with an adaptive gain control feedback path constructed in accordance with the present invention.

Referring to FIG. 2, it illustrates a functional block diagram of the direct modulation of a VCO with an adaptive gain control feedback path constructed in accordance with one embodiment of the present invention. The base band processor 215 provides the digital control signals, VCO_mod, D_in, Freq_carrier and a reference frequency signal $f_{ref}$. A fractional-N frequency synthesizer PLL 200 is used as a functional building block.

The phase-locked loop 200 includes a phase detector 204, a loop filter 203, a voltage controlled oscillator (VCO) 201 and a loop divider 205. The phase detector 204 serves as a comparator means for comparing the reference frequency signal $f_{ref}$ to the divided frequency signal $f_x$ from the output of the loop divider 205. The phase detector 204 generates a frequency tuning control signal that is coupled to the loop filter 203. The voltage level of this frequency tuning control signal is proportional to the difference in frequencies of the compared signals. The loop filter 203 receives and filters the frequency tuning control signal and provides a control signal to the adder 202 which output is coupled to VCO 201. The VCO 201 serves as a frequency generation means for generating the loop output signal $f_{out}$ in response to the VCO input control signal. The loop divider 205 is coupled to the output of the VCO 201 and generates a frequency divided signal that corresponds to the frequency to the VCO output signal. The output of the loop divider 205 $f_x$ is provided as the loop feedback signal to one of the two inputs of the phase detector 204.

The direct modulation of a VCO is performed by coupling a VCO modulation signal, vco_direct, and the output of loop filter 203 to VCO 201 with an adder 202. The output of the adder 202 is coupled to VCO 201 to generate the modulated frequency signal, $f_{out}$. The baseband VCO modulation data, vco_mod, is multiplied by a scaling value through the gain block 209. The output of the gain block 209 is coupled to digital-to-analog (D/A) converter 208 to form an analog modulation signal, vco_direct.

When the outlined Fractional-N PLL 200 is locked at the reference frequency, $f_{ref}$, during the modulation, the direct VCO modulation signal, vco_direct, exactly cancels the frequency change of the feedback signal, $f_x$. The modulated output frequency of VCO 201 is fed back to the loop divider 205 with output, $f_x$, coupled to phase detector 204 and frequency-to-digital converter 211. The fractional-N PLL 200 is performed to lock the VCO 201 at the carrier frequency, while the modulation signal, vco_direct, is injected through the adder 202 to the input of VCO 201 in an open loop manner to generate a directly modulated signal with wide bandwidth.

According to one embodiment, the VCO frequency drift and other nonlinear effects can be compensated by using an adaptive VCO gain control feedback path which includes a delta-sigma frequency-to-digital converter (FDC) 211, a weighting filter with look-up table 210, and gain control block 209 and a digital-to-analog (D/A) converter 208. An example of a delta-sigma frequency-to-digital converter 211, described in the article "An Oversampling Delta-Sigma Frequency Discriminator" by R. D. Beards and M. A. Copeland, IEEE Trans. on Circuits and Systems-II, Vol. 41, No. 1, pages 26 to 32, January 1994, which is hereby incorporated by reference, is to generate a binary bit stream that represents the frequency value of the input signal. The frequency drift of VCO 201 results in a corresponding change of the feedback frequency $f_x$ of the loop divider 205. The feedback signal $f_x$ is coupled to the FDC 211 with a reference frequency $f_{ref}$ to form a delta-sigma modulated data stream which represents the feedback frequency $f_x$ in accordance with the reference clock $f_{ref}$.

This delta-sigma modulated data stream is coupled to a weighting filter with look-up table 210. The weighting filter with look-up table 201 filters and decimates the input data stream with a weighted accumulation function and outputs a scaling value from the look-up table by using linear interpolation. This gain value is provided to the gain unit 209 that multiplies the VCO modulation data vco_mod by the scaling value. The scaled modulation data generated by the gain unit 209 is then converted by digital-to-analog (D/A) converter 208 to an analog signal, VCO_direct, coupled to the input of adder 202 with the output signal of the loop filter 203.

The scaling value of the gain unit 209 on the gain control feedback path changes the VCO gain in the direction that reduces the frequency difference between the output of loop divider 205 and the reference frequency, $f_{ref}$. The initial scaling values of gain unit can be calibrated by providing a known modulation signal at different carrier frequencies as calibration points. The calibrated scaling values are then stored in a look-up table in the weighting filter with look-up table 210. At the carrier frequency, the VCO is phase locked by the fractional-N PLL 200 within a narrow bandwidth, and the frequency drift of VCO 201 is overcome by the VCO gain control feedback path. The actually modulation data vco_mod is fed directly to VCO 201 in an open loop manner, thus the modulation bandwidth is only limited by the D/A converter 208, but not the bandwidth of fractional-N PLL 200. Thus, the direct modulation of a VCO with wide bandwidth and low phase noise can be achieved simultaneously. By adaptively scaling the VCO modulation data, vco_mod, in accordance with the frequency difference detected by the FDC 211, the VCO frequency drift and other nonlinear effects can be compensated.

As the fractional-N PLL 200 is applied to track the carrier frequency without passing the modulation signal into the loop filter 203, it can be implemented easily using a narrow loop bandwidth. The wide bandwidth phase-modulated signal is directly up-converted to the RF signal by directly modulating the VCO 201 through the VCO gain control feedback path with the Adder 202. Thus, both wide bandwidth and low output noise for a phase modulation can be achieved.

Figure 3:
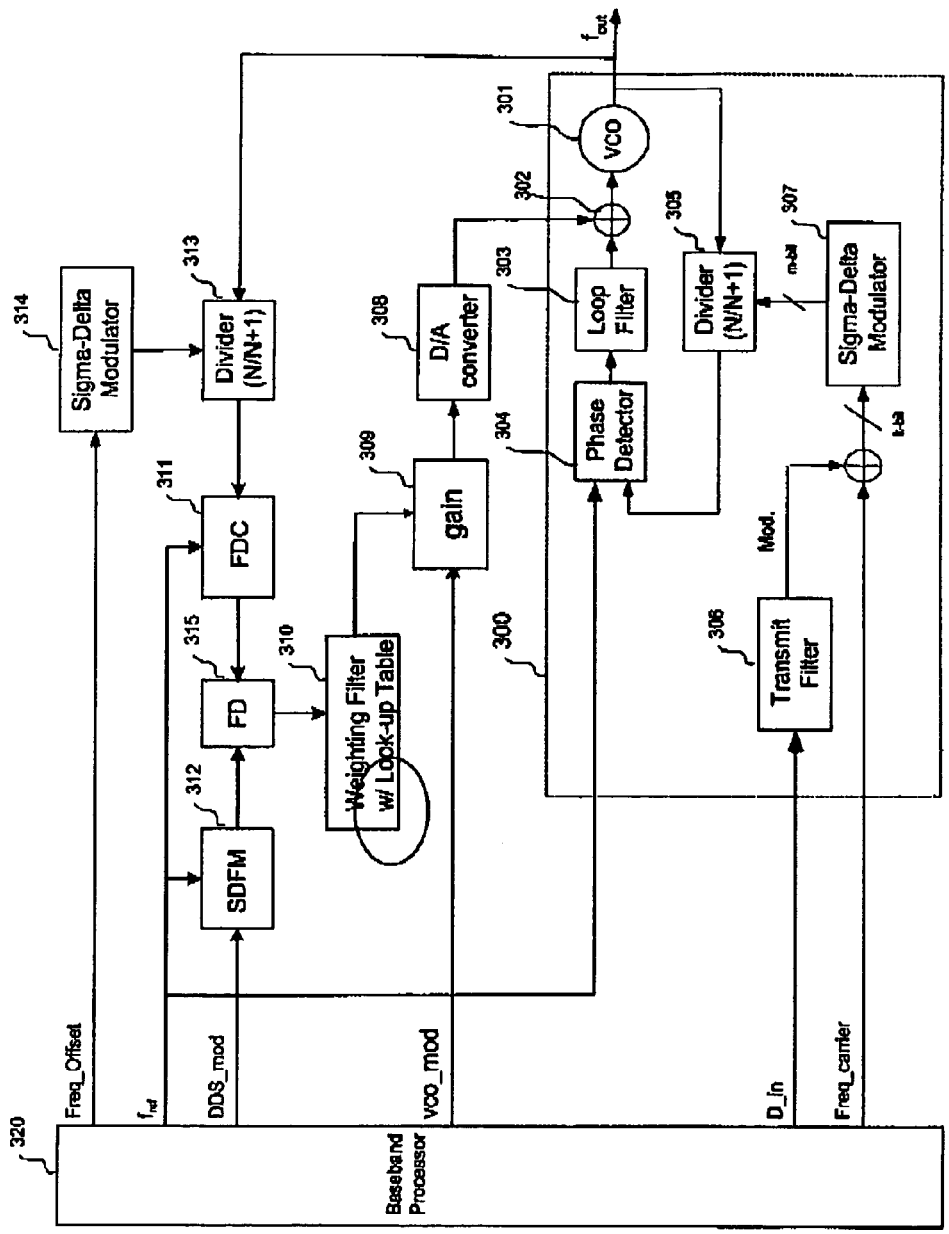
FIG. 3 is a block diagram of an alternative embodiment with the direct modulation of a VCO like that of FIG. 2, but incorporating a frequency offset function in accordance with the present invention.

Referring now to FIG. 3, is a block diagram of another embodiment for direct modulation of a VCO similar to that of FIG. 2, but incorporating a frequency offset function with a sigma-delta frequency modulator (SDFM) 312. The SDFM 312 converts the baseband frequency modulated signal DDS_mod into a sigma-delta modulated bit stream as a reference signal at the defined offset frequency Freq_Offset by using Direct Digital Synthesizer (DDS) technique. According to FIG. 3, the fractional-N PLL 300 is used as a functional building block. The baseband processor 320 provides the digital control signals, Freq_offset, DDS_mod, vco_mod, D_in, Freq_carrier and reference clock $f_{ref}$. The frequency offset function is implemented by using a dual-mode N/(N+1) frequency divider 313 that is also referred to as an offset divider with a sigma-delta modulator 314. The frequency divider 313 and the sigma-delta modulator 314 have the same functionality as the loop divider 305 and Sigma-delta modulator 307 used in the fractional-N PLL 300. The output frequency of the divider 313 is set by the offset frequency control signal Freq_Offset. The output of frequency-to-digital converter (FDC) 311 represents the frequency value of the output of divider 313. The frequency detector 315 generates a frequency error value by differentiating two input signals coupled to the frequency-to-digital converter (FDC) 311 and the SDFM 312. The frequency error generated by frequency detector 315 is coupled to weighting filter with look-up table 310 which filters the input frequency error signal and outputs a scaling value from the look-up table by using linear interpolation.

This scaling value is provided to the gain unit 309 that multiplies the VCO modulation data, vco_mod. The scaled modulation data generated by gain unit 309 is then converted by digital-to-analog (D/A) converter 308 to an analog signal which is provided to the input of the adder 302 with the output signal of the loop filter 303. The VCO 301 is then modulated by the output of the adder 302 which combines gain scaled direct modulation signal vco_mod and the loop tuning signal produced by the loop filter 303 in the PLL 300. The functions of the weighting filter 310, the gain unit 309 and the D/A converter 308 and the PLL 300 have the same functionality as illustrated in FIG. 2.

By using the architecture shown in FIG. 3, the offset frequency, Freq_Offset, can be set flexibly to a frequency that has the lower spurious noise in accordance with the spectrum noise pattern of the sigma-delta modulation used in the frequency-to-digital converter 311 and sigma-delta frequency modulator 312. Thus, the high spectral purity can be achieved.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

I claim:

1. A frequency synthesizer with direct modulation of a voltage-controlled oscillator for radio-frequency (RF) signals, the frequency synthesizer comprising:
   a clock outputting a reference frequency signal;
   a voltage-controlled oscillator (VCO) generating a RF signal;
   a VCO gain control feedback path to form a first modulation path;
   a phase-locked loop (PLL) to form a second modulation path, wherein the first modulation path and the second modulation path modulate the voltage-controlled oscillator; and
   a circuit including a look-up table storing initial scaling values and updated scaling values to scale a modulated digital signal produced from a digital baseband processor, wherein the circuit is coupled to the first modulation path, and the updated scaling values are determined in response to error signals from a frequency detector comparing the reference frequency signal and a divided frequency signal from the phase-locked loop.

2. The frequency synthesizer of claim 1, wherein the VCO gain control feedback path comprises:
   a loop divider coupled to an output of the VCO and shared with the phase-locked loop to down-convert the RF signal to a lower frequency signal, the frequency detector coupled to an output of the loop divider to calculate the divided frequency signal in accordance with the reference frequency signal;
   a weighting filter with the look-up-table coupled to an output of the frequency detector to generate the updated scaling values by using weighting and interpolation functions with the look-up table;
   a gain unit coupled to an output of the weighting filter with look-up-table to scale the modulated digital signal with the undated scaling values.

3. The frequency synthesizer of claim 2, wherein the VCO gain control feedback path further comprise:
   an offset divider coupled to an output of the VCO to down converter the VCO output to a predefined intermediate frequency (IF); and
   a frequency modulator coupled to the digital baseband processor and the frequency detector to convert the modulated digital signal to the predefined intermediate frequency (IF).

4. The frequency synthesizer of claim 1, wherein the first modulation path provides a first input signal to the voltage-controlled oscillator, after processed in the gain unit, is converted to an analog signal.

5. The frequency synthesizer of claim 1, wherein the second modulation path formed by the phase-locked loop provides a second input signal to the voltage-controlled oscillator, and the phase-locked loop including an adder that couples both the first and second input signals to modulate the voltage-controlled oscillator.

6. The frequency synthesizer of claim 1, wherein the phase-locked loop further comprises:

a phase detector to compare two phase-modulated signals and produce an output representing the phase difference of the two phase-modulated signals;

a loop filter coupled to the phase detector and the VCO;

a feedback loop including a loop divider which is coupled to the VCO and the phase detector;

a reference frequency signal also coupled to the phase detector; and a modulator receiving a phase-modulated baseband signal and a carrier frequency signal to produce a digital bit stream used to control a divisor of the feedback frequency divider.

7. A method for directly modulating a VCO with adaptive gain control for generating radio frequency (RF) signals, the method comprising:

generating a RF signal in a voltage-controlled oscillator;

measuring the RF signal with a reference frequency;

modulating a voltage-controlled oscillator (VCO) with a first modulation path and a second modulation path, wherein the first modulation path is formed by a VCO gain control feedback path, and the second modulation path is formed by a phase-locked loop (PLL);

scaling a modulated digital signal which is provided from a digital baseband processor for the first modulation path responsive to updated scaling values stored in a look-up table included a circuit coupled to the first modulation path, and wherein the updated scaling values are determined in response to error signals from a frequency detector in comparing the reference frequency signal and a divided frequency signal from the phase locked loop.

8. The method of claim 7, wherein the VCO gain control feedback path includes a frequency divider or a down converter, the frequency detector, a weighting filter with a look-up table, a gain unit, a digital-to-analog converter, and provides feedback signals to at least the look-up table.

9. The method of claim 8, wherein the frequency downconverter converts the RF signal to a lower frequency to be converted into a data stream in the frequency-to-digital converter, and the data stream is calculated in the weighting filter with look-up table in accordance with the reference frequency to generate the scaling value.

10. The method of claim 9, wherein the scaling value is generated through the weighting filter and is used in the gain unit to scale the modulated digital signal from the digital baseband processor.

11. The method of claim 7, wherein the first modulation path provides a first input signal to the voltage-controlled oscillator, after processed in the gain unit, is converted to an analog signal.

12. The method of claim 7, wherein the second modulation path formed by the phase-locked loop provides a second input signal to the voltage-controlled oscillator, and the phase-locked loop including an adder that couples both the first and second input signals to modulate the voltage-controlled oscillator.

13. The method of claim 7, wherein the phase-locked loop further comprises:

a phase detector to compare two phase-modulated signals and produce an output representing the phase difference of the two phase-modulated signals;

a loop filter coupled to an output of the phase detector and to an input of the VCO;

a feedback loop including a loop divider which is coupled to an output of the VCO and to an input of the phase detector;

a reference frequency signal coupled to another input of the phase detector; and a modulator receiving a phase-modulated baseband signal and a carrier frequency signal to produce a digital bit stream used to control a divisor of the loop divider.

14. The method of claim 8, wherein the VCO gain control feedback path may alternatively further comprises:

a frequency offset divider to down converter the VCO output signal to a predefined intermediate frequency (IF);

a frequency modulator to convert the baseband frequency modulation signal to a modulated data stream with predefined intermediate frequency (IF); and a frequency detector to generate a frequency error value for the weighting filter with look-up table by differentiating two frequency signals generated by the frequency-to-digital converter and the frequency modulator;

a frequency-to-digital converter coupled to the output of the offset divider and an input of the frequency detector to calculate the frequency value in accordance with the reference frequency signal.

15. The method of claim 14, wherein the predefined intermediate frequency (IF) is selected from pre-calculated frequencies in accordance with the related spectrum noise pattern of the frequency-to-digital converter and the modulator.

16. The method of claim 7, wherein the initial scaling values are calibrated by providing a known constant modulation signal at different carrier frequencies as calibration points to compensate the nonlinear effect of the VCO gain when using the gain control feedback path to form the first modulation path.

* * * * *